(12) United States Patent
Elias

(10) Patent No.: US 6,980,945 B2
(45) Date of Patent: Dec. 27, 2005

(54) SYNCHRONIZED SIMULATION OF SOFTWARE AND HARDWARE IN THE ANALOG DOMAIN

(75) Inventor: Norman J. Elias, Trumbull, CT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 739 days.

(21) Appl. No.: 10/011,887

(22) Filed: Dec. 4, 2001

(65) Prior Publication Data
US 2003/0105619 A1 Jun. 5, 2003

(51) Int. Cl.[7] .............................................. G66G 7/62
(52) U.S. Cl. ......................................... 703/17; 703/22
(58) Field of Search .............................. 703/13, 14, 22, 703/4, 17; 716/1, 4

(56) References Cited

U.S. PATENT DOCUMENTS 6,006,022 A * 12/1999 Rhim et al. ..................... 716/1
6,490,545 B1 * 12/2002 Peng ............................ 703/13
6,584,436 B2 * 6/2003 Hellestrand et al. ........... 703/13
6,701,490 B1 * 3/2004 Talukdar et al. ................ 716/4
6,785,873 B1 * 8/2004 Tseng ............................ 716/4

* cited by examiner

Primary Examiner—Albert W. Paladini

(57) ABSTRACT

The present invention provides a method for accurately evaluating the operation of a device by the synchronized analog simulation of software and hardware using numerical integration to model the hardware. The synchronized simulation is conducted by a control program that is embedded in the software processing model and superimposed on the numerical integration program so as to execute the software operating instructions in proper time relation relative to the calculated hardware waveforms. The invention control program determines whether hardware simulation time has passed to a point at which the prior operating instruction has been completed, and the next instruction is to be executed. The program computes elapsed time for the software and schedules the activation of the next instruction.

16 Claims, 2 Drawing Sheets

If next_flag is on:
- C1. Set elapsed_time = 0
- C2. Execute next process instruction (HEX code)
- C3. Add elapsed time + run_time + wait time = updated elapsed_time
- C4. Is $t_{j-1}$ + elapsed_time ≥ $t_n$?
- C5. If no, repeat steps C2, C3, C4
- C6. If yes, set next_flag off
- C7. Schedule next_flag on at t = $t_{j-1}$ + elapsed_time If a hazard is detected:
- C8. Schedule ISR at t = $t_{j-1}$ + elapsed_time
- C9. Is t = $t_{j-1}$ + elapsed_time
- C10. If yes, activate ISR If next_flag is on:

C1.    Set elapsed_time = 0
    C2.    Execute next process instruction (HEX code)
    C3.    Add elapsed time + run_time + wait time = updated elapsed_time
    C4.    Is $t_{i-1}$ + elapsed_time $\geq t_n$?
    C5.    If no, repeat steps C2, C3, C4
    C6.    If yes, set next_flag off
    C7.    Schedule next_flag on at t = $t_{i-1}$ + elapsed_time If a hazard is detected:

C8.    Schedule ISR at t = $t_{i-1}$ + elapsed_time
    C9.    Is t = $t_{i-1}$ + elapsed_time
    C10.    If yes, activate ISR

FIG. 2

SYNCHRONIZED SIMULATION OF SOFTWARE AND HARDWARE IN THE ANALOG DOMAIN

FIELD OF THE INVENTION

The present invention relates to the field of computer modeling software and more particularly to such software for testing physical apparatus combining analog hardware with microprocessor software by synchronized simulation of that hardware and software.

BACKGROUND OF THE INVENTION

The use of microprocessor operated software to control the functioning of analog electronic devices is increasing. Computer modeling software has been developed to simulate and evaluate such analog systems as a design aid. The target role of this computer modeling includes (but is not limited to):
1. Debugging and verifying the microprocessor software and its interactions with the hardware,
2. Verifying specification of new hardware modules proposed for incorporation into the electronic device, and
3. Comparative evaluation of alternative microprocessor products for running the operating software.

To check and refine the complete design in this manner, simultaneous operation of the hardware and the software must both be modeled, but this has been done only in the digital domain. Known digital simulation programs incorporate analog components as behavioral descriptions that do not accurately evaluate the system at an analog waveform level. Therefore, to achieve a desired degree of accuracy, each simulation of an analog system has required custom programming to fit the needs of the project. Custom programs are typically specific to the actual steps in the operating software, whereas a general test and simulation program should be machine-independent down to the hexadecimal code level.

The simultaneous simulation of hardware and software in the digital domain has been done with such products as Seamless® Hardware/Software Co-Verification by Mentor Graphics and SPW® (Signal Processing Workstation) by Cadence Design. However, none of the existing systems for co-simulation of hardware and software supports the analog waveform simulation needed to obtain an acceptable level of detail to accurately verify analog system performance. A custom designed program can be created for such analog accuracy, but associated costs make this route prohibitive for anything short of large scale systems.

A software analog simulation capability has been demonstrated by Avant! comprising a micro-controller model that executes software during analog simulation. Unfortunately, this model restricts the numerical integration of the analog equations to fractions of a microsecond corresponding to the microprocessor clock. This small time-step limitation makes it impractical to simulate significant portions of system operation.

As used in the description below, the operating software directs input to the model or physical hardware based on feedback, and the control software actuates the simulation model.

Therefore, it is an object of the present invention to provide a method for the synchronized simulation of system hardware together with its controlling microprocessor software in the analog waveform domain.

It is another object of the present invention to provide a method for accurately synchronizing the execution of software instructions in physically correct time coordination to the numerical integration algorithm that computes the analog hardware waveforms.

It is a further object of the present invention to provide a method for the synchronized simulation of a broad range of system hardware and software.

It is a further object of the present invention to provide a method to incorporate actual implementation of the software, including arbitrary variations consistent with the prescribed instruction set of the microprocessor.

It is a still further object of the present invention to provide a method for the synchronized simulation of system hardware and software without restricting the integration time increments used to compute the hardware waveforms.

These and other objects will become more apparent from the description of the invention to follow.

SUMMARY OF THE INVENTION

The present invention provides a method for the analog simulation of hardware models at the analog waveform level together with the sequence of software instructions provided by an associated operating program. A control program inherent to the invention executes the operating program instructions in synchronized relation to the hardware operating time values determined by the numerical integration of the hardware model. The control program of the invention advances to the next step in the operating program when the corresponding hardware action is completed. The control program computes the elapsed time for each step of the operating program and schedules a time for the activation of the next instruction.

BRIEF DESCRIPTION OF THE DRAWINGS

FIG. 2 is a process chart of steps for synchronizing operating software instruction activation with hardware simulation.

DETAILED DESCRIPTION OF THE INVENTION

Figure 1:
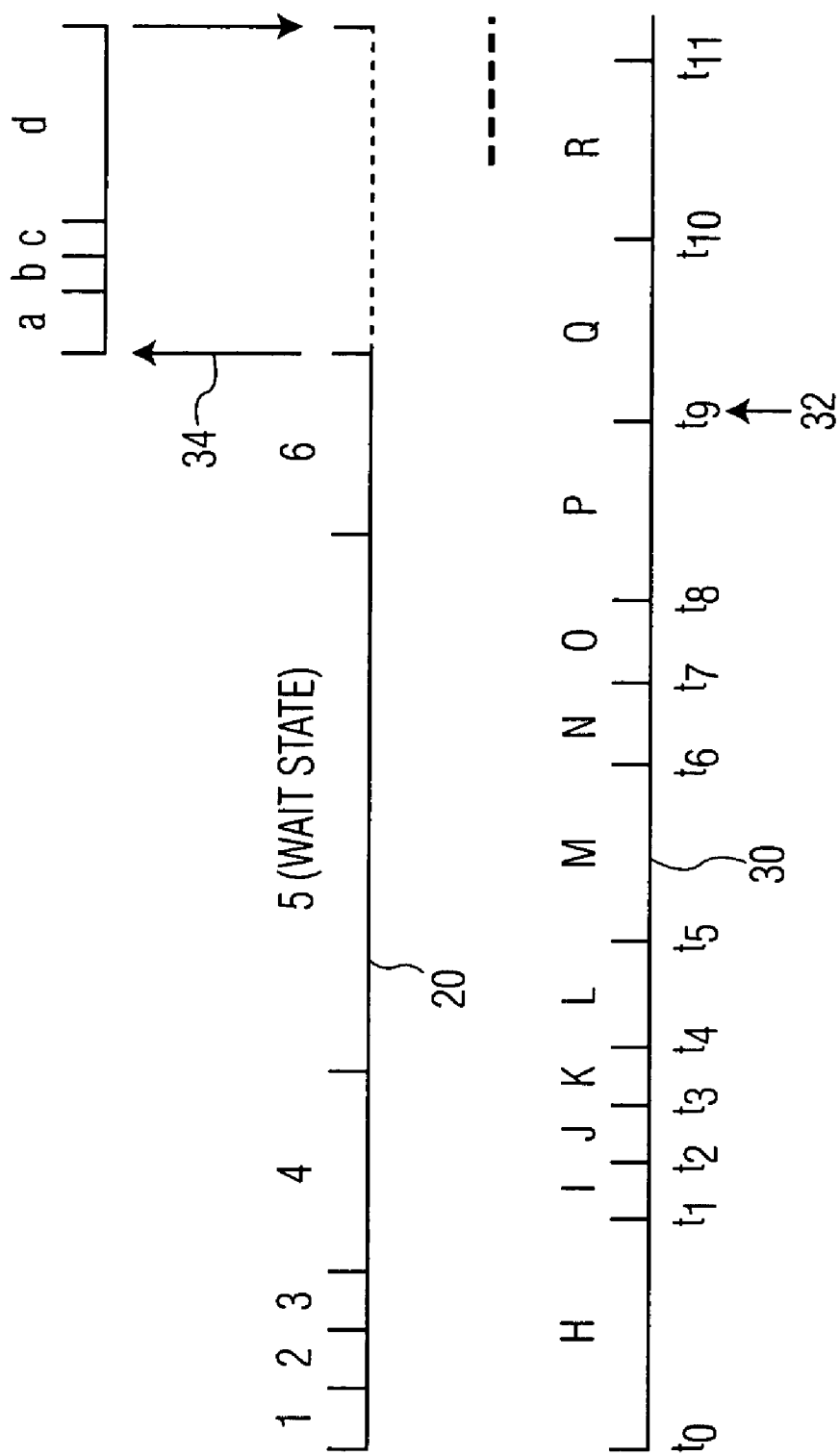
FIG. 1 illustrates the synchronization of software instructions with the hardware simulation through exemplary situations.

Apparatus development frequently involves predicting the behavior of the planned device through the creation and running of a computer model. The model approximates the physical attributes of the device it represents by calculation of mathematical formulas so as to ultimately enable refining the proposed design to approach its production manifestation goal. For each function the device performs, the modeling formulas encompass a determination of the time expended in performing that function and a predictive evaluation of how well the functions are expected to be performed. An analog electronic fluorescent lamp ballast is an example of an apparatus that performs functions and is susceptible to mathematical modeling. The functional steps include, for example, start-up, maintaining a regulated power level for a predetermined time, initiating a second ignition if the first start up attempt does not succeed, modifying power input after ignition occurs, etc.

In order to control the device in a manner intended for maximizing its efficiency, increasing numbers of devices are being controlled in their operations with micro controller units (MCUs). The MCU comprises a microprocessor core is capable of initiating and running software instructions including calculations of system control variables, memory for storing calculation results, and peripheral apparatus for sensing hardware conditions and transmitting calculation results.

Computer modeling of the MCU and of the device it controls requires simulated activation of the operating program instructions along with the model of the hardware. This combination provides a parallel test of the apparatus computer model and its intended operative software. Prior known methods for simultaneously simulating hardware and software operation only permitted an independent test of the digital processing, whereas combined testing of the analog and digital processing is required for a complete, accurate and fully reliable test.

Referring now to FIG. 1 a software timeline 20 is shown on the upper chart portion with time increasing from left to right and with a series of software operations 1–8 that are activated sequentially. A subroutine in the software program, interrupt service routine (ISR) is inserted at steps 34–36, arbitrarily positioned in the diagram upon the completion of software step 6. A hardware timeline 30 is shown on the lower portion with time being similarly depicted, and showing calculated intervals of time for the simulated actuation of hardware operations noted. Hardware timeline 30 shows time divisions $t_0$ through $t_{12}$. Both software timeline 20 and hardware timeline 30 are comprised of a series of exemplary steps and are described in principle as one of many possible embodiments of the invention. In an actual application of the invention, software timeline 20 might have more or fewer operations than the eight shown, as hardware timeline 30 could be divided into a different number of steps than twelve.

Both software timeline 20 and hardware timeline 30 start at the same time point $t_0$ and operate in parallel. A control program, depicted in the operating chart of FIG. 2, is superimposed in this system so as to synchronize the activation of software operating instructions to the time-steps in the simulated hardware waveforms. The control program of the present invention is preferably written in a simulator's hardware description language such as Saber's MAST® language, or the recently established industry standard VHDL-AMS language. Tying software timeline 20 and hardware timeline 30 to one another in this manner provides the accurate time sequence that is critically important for analog modeling.

As will be understood by those skilled in the art, the simulated hardware operations depicted along hardware timeline 30 occupy varying amounts of time. For example, the first hardware operation that occurs during the time period $t_0$–$t_1$ occupies approximately as much time to complete as does the next three operations (time periods $t_1$–$t_4$). Similarly, software timeline 20 is divided into steps that represent the sequential operations of the software program for controlling the modeled hardware. Thus, software steps 1 through 3 are shown to occupy an amount of time that approximately equals the amount of time for step 4. Software steps 1 through 3 are completed before the first time mark $t_1$ on hardware timeline 30, as will be more fully described below.

At the origin time point $t_0$ on hardware timeline 30, the system clock begins and the first simulated hardware operating step starts, continuing for a period of time until time point $t_1$, according to hardware modeling integration calculations. At each time point on hardware timeline 30, starting at time $t_0$, the control program illustrated in FIG. 2 determines if the next_flag switch is set to on, indicating its state for proceeding to activate software process instructions. The query to determine if the next_flag is on remains active at all times. The "next_flag" switch represents a signal embedded in the modeling software. The next process instruction in the operating program is activated when the next_flag is on. In the control program of FIG. 2, time for hardware integration is depicted in the control formulas with a subscript "n", and time in the software realm with a subscript "i."

Upon hardware system start up, the control program next_flag switch is on. With next_flag set to on, the program depicted in FIG. 2 sets elapsed_time= 0 at step C1, followed by executing the next process instruction, as represented in hexadecimal (HEX) code, at step C2. Whereas each process instruction in a software program takes a finite amount of time to complete, an updated elapsed time value for completing the instruction is determined and accumulated in the control program at step C3 by application of the formula: stored elapsed_time+run_time+$t_{wait}$=updated elapsed_time. Run_time is the span of time for the MCU to run each operating instruction. In the preferred embodiment of the present invention, the time value for completing each instruction in the operating program is calculated based on data published in the documentation for the MCU through which the operating program is implemented. The updated elapsed time value is stored in the control program. At the completion of step C3, the control program refers to a continuously running clock and determines in step C4 whether $t_{i-1}$+elapsed_time$\geq t_n$ (whether the time value at the end of the previous operating step plus the elapsed time stored in the control program is greater than or equal to the present hardware integration time value). If the time is not greater than or equal to the present hardware integration time, step C5 requires that steps C2, C3, and C4 of FIG. 2 be repeated, i.e. an additional instruction is run. If the time is greater than or equal to the present hardware integration time, step C6 requires that the next_flag is set to off, so that no further instructions are run. At step C7 the next_flag signal is scheduled to be turned on at time t=$t_{i-1}$+elapsed_time. At this point, the software is in pause mode while the hardware simulation process continues. When t=$t_{i-1}$+elapsed_time, the next_flag switch is turned on and the control program is activated for an additional cycle.

According to the hardware simulation portrayed on hardware timeline 30, during the time that the first hardware simulation process runs ($t_0$–$t_1$), as per the calculated hardware operating time values, operating process instructions 1, 2, and 3 on software timeline 20 are completed, and operating process instruction 4 is begun. As seen by comparison of software timeline 20 and hardware timeline 30, hardware operations I and J are completed and operation K is begun during software instruction 4. The hardware operations continue serially, each occupying the calculated time value, and the operating software steps are coordinated to the hardware operations according to the control program of the invention.

It is common for a system software program to involve a wait state, for example for a programmed determination of whether or not a particular condition is satisfied. In the example of a fluorescent lamp ballast, the required condition may be that the lamp has ignited, and the next software process step 5, a wait state, is initiated at a time between $t_3$ and $t_4$, and continues to a time between $t_8$ and $t_9$ to determine if ignition succeeded. During the time that the operating software has been in the step 5 wait state, hardware step K has completed as well as steps L, M, N and O, and step P has begun, according to hardware timeline 30. As noted above, the representations of FIG. 1 depict a general model and are not to be construed to restrict the present invention to any particular actual equipment.

The illustration of FIG. 1 shows hardware step P completing, according to calculated values at time $t_9$, followed shortly by an operating hazard or failure being detected, as portrayed by arrow 32. The determination query "If a hazard is detected" in the operating chart of FIG. 2 is always available. Correction of, or compensation for, a particular hazard, or failure, involves the activation of a software subroutine as outlined in control steps C8, C9 and C10. When a problem is detected, as shown at arrow 32, step C8 of the control program causes an interrupt service routine (ISR) as a subroutine to be scheduled to activate at $t=t_{i-1}+\text{elapsed\_time}$. Deferral of ISR activation parallels the MCU operation by which the ISR is prevented from starting during the running of a software step. The logical interpretation of the expression $t=t_{i-1}+\text{total\_time}$ is the time of completion of the presently running software process instruction. When the determinative formula is satisfied in step C9, the ISR is activated. In FIG. 1 this is shown to occur at the completion of process instruction 6, being nominally between $t_9$ and $t_{10}$. When the ISR is activated in step C10, the simulated run of the operating software along timeline 20 is suspended and the MCU placemarks the event by storing the state of the software so that the return to the main operating software can be accurately modeled at the completion of the ISR. Arrow 34 in FIG. 1 indicates the activation of ISR subroutine steps a, b, c and d, with individual steps depicted as occupying differing amounts of time. A specific subroutine is available for various different problems or hazards that may be encountered in the particular hardware device being simulated. ISR subroutines are supplied as part of the operating software and may involve more or less than the four steps exemplified in FIG. 1. At the completion of the ISR subroutine, steps a–d in the figure, the software returns at arrow 36 to the main program depicted along software timeline 20 to execute steps 7 and 8 at a time point between $t_{11}$ and $t_{12}$. During the operation of the subroutine, the hardware simulation has continued its sequence to complete step Q, run step R, and begin step S. Simulated hardware step S completes during the operation of software steps 7 and 8.

Thus, as described above and illustrated in the accompanying figures, the control program of the invention acts to synchronize the execution of an MCU run operating program with a model of analog hardware to achieve waveform-level accuracy in analog and mixed-analog/digital simulation. The control program disclosed provides a practical method for the co-simulation of hardware and software in analog format and at the same time avoiding small time steps. The number and duration of operations being executed are allowed to vary and still be coordinated.

While the present invention is described with respect to specific embodiments thereof, it is recognized that various modifications and variations may be made without departing from the scope and spirit of the invention, which is more clearly and precisely defined by reference to the claims below.

What is claimed is:

1. A method for synchronizing operating software instruction activation with hardware simulation via a program, comprising the steps of: (a) executing a next process instruction in the operating software at each time point on a hardware timeline of the hardware simulation where the time points divide the hardware timeline into calculated intervals of time for simulated actuation of hardware operations; (b) pursuant to executing the next process instruction, adding a run time and a wait time to a stored elapsed time to obtain an updated elapsed time for a sequence of instructions; (c) turning off a switch to defer activation of the next process instruction while hardware simulation continues; and (d) scheduling restoration of the switch to its on state and activating execution of the next process instruction at a selected time.

2. The method as described in claim 1, further comprising the step of determining if the updated elapsed time plus a time representing the completion of an immediately past instruction step is greater than or equal to a current hardware integration time.

3. The method as described in claim 2, wherein if the updated elapsed time plus a time representing the completion of an immediately past instruction step is not greater than or equal to a current hardware integration time, further comprising repeating the steps of; (a) executing a next process instruction in the operating software; (b) pursuant to executing the next process instruction, adding a run time and a wait time to a stored elapsed time to obtain an updated elapsed time for a sequence of instructions; (c) and, further determining if the updated elapsed time plus a time representing the completion of an immediately past instruction step is greater than or equal to a current hardware integration time.

4. The method as described in claim 1, wherein the selected time for scheduling setting the switch to its on state is equal to the elapsed time plus a time representing the completion of the immediately past instruction step.

5. The method as described in claim 1, further comprising the step of determining whether the switch to activate a next process instruction is set on, and if the switch is not set on, remaining inactive.

6. The method as described in claim 5, further comprising the step of determining whether the switch to activate a next process instruction is set on, and if the switch is set on, activating the next process instruction.

7. The method as described in claim 5, further comprising the step of determining whether the elapsed time plus a time representing the completion of the immediately past instruction step is greater than or equal to a current hardware integration time.

8. The method as described in claim 5, wherein if a hazard condition is detected the initiation of a repair process is scheduled at a time equal to the elapsed time plus a time representing the completion of the immediately past instruction step.

9. The method as described in claim 8, wherein the repair comprises an interrupt service routine.

10. The method as described in claim 9, wherein the interrupt service routine is adapted for correcting a specific hazard condition detected.

11. The method as described in claim 8, further comprising discontinuing the execution of process instructions while the repair is active and further comprising activating the repair.

12. The method as described in claim 9, further comprising at the completion of the execution of the interrupt service routine executing the next process instruction.

13. Apparatus for synchronizing operating software instruction activation with hardware simulation, the apparatus comprising: (a) an MCU being programmed for the synchronized simulation of an operating software program and the process steps of the computer model; and (b) the MCU program comprising means for the determination of selected time points for simulated actuation of hardware operations at which to activate sequential process instructions.

14. The apparatus for evaluating the operation of a device as described in claim 13, wherein the means for the determination of selected time points comprise a formula to compare a sum of an updated elapsed time plus a time representing the completion of an immediately past instruction step to a hardware integration time.

15. A method for synchronizing operating software instruction activation with hardware simulation comprising the steps of: (a) programming an MCU for the synchronized simulation of an operating software program and the process steps of the computer model; and (b) determining selected time points for simulated actuation of hardware operations at which to activate sequential process instructions.

16. The method for evaluating the operation of a device as described in claim 15, wherein determining selected time points includes comparing a sum of an updated elapsed time plus a time representing the completion of an immediately past instruction step to a hardware integration time.

* * * * *